United States Patent [19]
Eberhardt

[11] Patent Number: 6,018,299
[45] Date of Patent: Jan. 25, 2000

[54] RADIO FREQUENCY IDENTIFICATION TAG HAVING A PRINTED ANTENNA AND METHOD

[75] Inventor: Noel H. Eberhardt, Cupertino, Calif.

[73] Assignee: Motorola, Inc., Schaumburg, Ill.

[21] Appl. No.: 09/103,226

[22] Filed: Jun. 23, 1998

Related U.S. Application Data

[63] Continuation-in-part of application No. 09/094,261, Jun. 9, 1998.

[51] Int. Cl.[7] .................................................. G08B 13/14
[52] U.S. Cl. ........................... 340/572.7; 29/846; 29/847; 156/250; 257/673; 343/700 MS; 361/748
[58] Field of Search .................. 340/572.7, 572.8; 343/789, 906, 700 MS; 29/825, 829, 846, 847, 729, 739, 740, 760; 257/673; 156/250; 428/901; 361/748, 760, 761, 765, 767, 777, 779

[56] References Cited

U.S. PATENT DOCUMENTS

| | | | |
|---|---|---|---|
| 3,843,036 | 10/1974 | Monahan et al. | 29/740 X |
| 4,783,646 | 11/1988 | Matsuzaki | 340/572.5 |
| 4,900,386 | 2/1990 | Richter-Jorgensen | 156/250 |
| 4,970,495 | 11/1990 | Matsumoto et al. | 340/572.1 |
| 5,081,445 | 1/1992 | Gill et al. | 340/572.1 |
| 5,288,235 | 2/1994 | Sobhani | 29/846 X |
| 5,430,441 | 7/1995 | Bickley et al. | 340/572.7 X |
| 5,528,222 | 6/1996 | Moskowitz et al. | 340/572.7 |
| 5,566,441 | 10/1996 | Marsh et al. | 29/840 X |
| 5,682,143 | 10/1997 | Brady et al. | 340/572.7 |
| 5,710,458 | 1/1998 | Iwasaki | 257/679 |
| 5,786,626 | 7/1998 | Brady et al. | 257/673 |

FOREIGN PATENT DOCUMENTS

| | | |
|---|---|---|
| 0 245 196 | 11/1987 | European Pat. Off. . |
| 0 260 221 | 3/1988 | European Pat. Off. . |
| 40 17 934 | 1/1992 | Germany . |

*Primary Examiner*—Thomas Mullen
*Attorney, Agent, or Firm*—Val Jean F. Hillman; Terri S. Hughes

[57] ABSTRACT

A radio frequency identification tag (14) includes a radio frequency identification tag circuit chip (12) coupled to an antenna (10) including a conductive pattern (22) printed onto a substrate (16). The substrate may form a portion of an article, a package, a package container, a ticket, a waybill, a label and/or an identification badge. The conductive pattern includes a first coupling region (28) and a second coupling region (30) arranged for coupling to the radio frequency identification tag circuit chip. The first coupling region and the second coupling region are precisely located and isolated from one another via an aperture (31) formed in the substrate.

51 Claims, 3 Drawing Sheets

RADIO FREQUENCY IDENTIFICATION TAG HAVING A PRINTED ANTENNA AND METHOD

CROSS-REFERENCE TO RELATED APPLICATIONS

The present application is a continuation-in-part of a commonly-assigned U.S. patent application by Noel H. Eberhardt et al. entitled "Radio frequency identification tag having an article integrated antenna," Ser. No. 09/094,261, filed Jun. 9, 1998, attorney docket number IND10149, the disclosure of which prior application is hereby expressly incorporated by reference, verbatim and with the same effect as though such disclosure were fully and completely set forth herein.

The present application is related to the following commonly-assigned prior U.S. patent applications: Ted Geiszler et al., "Remotely powered electronic tag and associated exciter/reader and related method," Ser. No. 08/540,813, filed Oct. 11, 1995, attorney docket number IND00701 (now abandoned); Victor Allen Vega et al., "Radio frequency identification tag system using tags arranged for coupling to ground," Ser. No. 09/031,848, filed Feb. 27, 1998, attorney docket number IND10153; Victor Allen Vega et al., "Radio frequency identification tag arranged for magnetically storing tag state information," Ser. No. 09/041,480, filed Mar. 12, 1998, attorney docket number IND10146; and Victor Allen Vega, "Radio frequency identification tag with a programmable circuit state," Ser. No. 09/045,357, filed Mar. 20, 1998, attorney docket number IND10174, the disclosures of which prior applications are hereby expressly incorporated herein by reference, verbatim and with the same effect as though such disclosures were fully and completely set forth herein.

FIELD OF THE INVENTION

The present invention relates generally to the field of radio-frequency identification tags including, but not limited to, radio frequency identification tags having a printed antenna.

BACKGROUND OF THE INVENTION

Radio frequency identification tags and radio frequency identification tag systems are known, and find numerous uses. For example, radio frequency identification tags are frequently used for personal identification in automated gate sentry applications protecting secured buildings or areas. Information stored on the radio frequency identification tag identifies the person seeking access to the secured building. A radio frequency identification tag system conveniently provides for reading the information from the radio frequency identification tag at a small distance using radio frequency (RF) data transmission technology. Most typically, the user simply holds or places the radio frequency identification tag near a base station that transmits an excitation signal to the radio frequency identification tag powering circuitry contained on the radio frequency identification tag. The circuitry, responsive to the excitation signal, communicates the stored information from the radio frequency identification tag to the base station, which receives and decodes the information. In general, radio frequency identification tags are capable of retaining and, in operation, transmitting a substantial amount of information—sufficient information to uniquely identify individuals, packages, inventory and the like.

A typical technology for powering and reading a radio frequency identification tag is inductive coupling or a combination of inductive power coupling and capacitive data coupling. Inductive coupling utilizes a coil element in the radio frequency identification tag. The coil element is excited (or "energized") by an excitation signal from the base station to provide power to the radio frequency identification tag circuitry. The radio frequency identification tag coil, or a second tag coil, may be used to transmit and receive the stored information between the radio frequency identification tag and the base station. Radio frequency identification tags relying on inductive coupling are sensitive to orientation of the radio frequency identification tag with respect to the base station since the field created by the excitation signal must intersect the coil element at substantially a right angle for effective coupling. Read ranges for inductively coupled devices are generally on the order of several centimeters. Longer read distances are desirable, and for certain applications, such as electronic animal identification, baggage tracking, parcel tracking and inventory management applications, are necessary.

Another technology for powering and reading radio frequency identification tags is electrostatic coupling such as employed in the radio frequency identification tag systems and radio frequency identification tags disclosed in the above referenced applications. These systems advantageously provide for substantially increased read/write distances over those available in the prior art. Another advantage derived from the use of the systems and tags therein disclosed is that the user need not bring the radio frequency identification tag in close proximity to a base station or to substantially orient the tag with respect to the base station. It is therefore possible to incorporate the antenna elements of the base station into, for example, a doorway or a vestibule, a package conveyer or an article sorting system, and to energize the tag and read the tag information at a greater distance.

To couple either the inductive or electrostatic signals between the base station and the radio frequency identification tag, the tag necessarily includes an antenna having at least one and frequently two antenna elements. Typically, a tag circuit chip and the antenna are electrically coupled and bonded to a tag substrate. The tag dimensions, governed by the tag substrate dimensions, are typically maintained fairly small. Therefore, the antenna is generally size limited. A smaller antenna, however, adversely affects read ranges. Also, the antenna is necessarily formed co-planar with the tag substrate potentially making the tag orientation sensitive. Because it is undesirable and generally impractical to make the radio frequency identification tag larger, effective antenna size remains limited. And, the typical flat tag design also limits the antenna to a flat, orientation sensitive configuration.

In accordance with preferred embodiments of the invention disclosed in the aforementioned United States Patent Application entitled "Radio Frequency Identification Tag Having an Article Integrated Antenna", it is proposed to form the antenna integral to an article. For example, a preferred implementation sees the antenna printed using conductive ink onto a cardboard or paper package. A radio frequency identification tag circuit chip is then secured to the article and electrically coupled to the antenna. In addition, it is proposed to provide radio frequency identification tag chip assemblies. The chip assemblies provide for bonding a radio frequency identification tag circuit chip to a substrate formed to include a conductive pattern. A preferred conductive pattern, as disclosed therein, is formed by printing the pattern onto a paper substrate using a conductive ink. The chip assembly may then be secured to the article and electrically coupled to the antenna via the conductive pattern.

As will be appreciated, alignment of the circuit chip with an antenna printed on the article or with a conductive pattern printed on the substrate is very important for proper operation of the circuit chip. More particularly, the circuit chip must be positioned within about +/−0.125 millimeter (mm) to properly mate the conductive pads on the circuit chip to the antenna and/or conductive pattern. However, typical technologies for printing the antenna and/or the conductive pattern onto paper or paper like materials will yield edge tolerances on the order of +/−1.5 mm. This edge tolerance dimension is larger than a typical circuit chip. Contributing to the imprecise edge tolerance are several factors including edge bleed of the printed pattern and variation in the location of the printed pattern relative to the substrate.

Thus, there is a need for an improved radio frequency identification tag.

BRIEF DESCRIPTION OF THE DRAWINGS

Preferred exemplary embodiments of the invention are illustrated in the accompanying drawings in which like reference numerals represent like parts throughout.

DETAILED DESCRIPTION OF THE PREFERRED EMBODIMENTS

Radio frequency identification tags in accordance with preferred embodiments of the present invention utilize a printed antenna formed onto a substrate. The substrate may form a portion of an article, a package, a package container, a ticket, a waybill, a label and/or an identification badge. In a preferred embodiment of the present invention, a coupling region is formed in the printed pattern by forming, by print depositing conductive ink, a conductive pattern on a substrate and then precisely forming coupling regions in the conductive pattern relative to the substrate.

Figure 1:
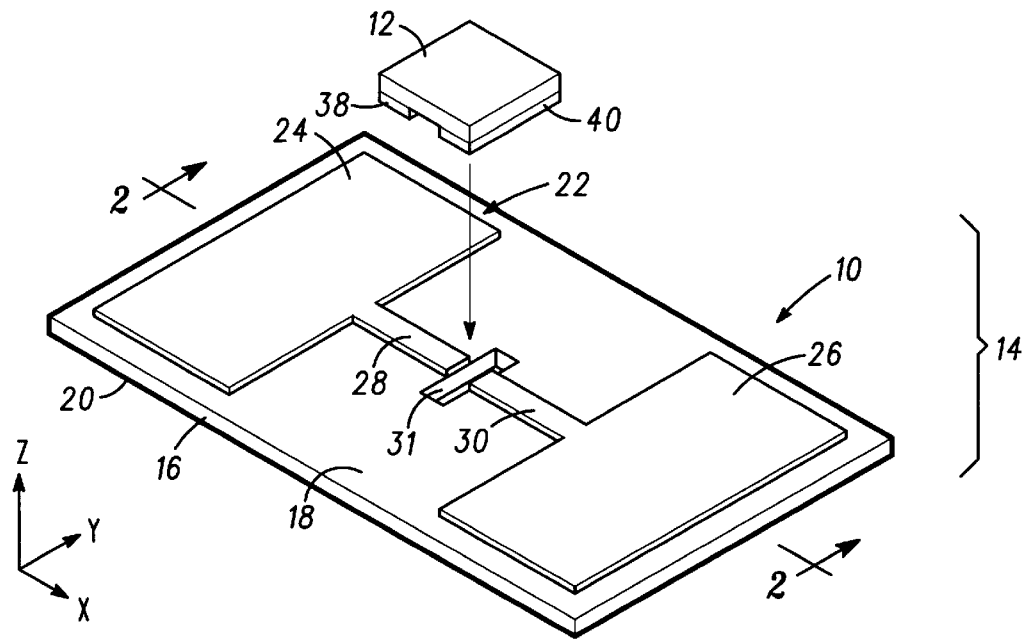
FIG. 1 is an exploded assembly view of a radio frequency identification tag in accordance with a preferred embodiment of the present invention.

Referring to FIG. 1 of the drawings, shown in exploded assembly view a radio frequency identification tag 14 includes a radio frequency identification tag circuit chip ("circuit chip") 12 secured to an antenna 10. Antenna 10 may form the basis for or a portion of a personal identification badge, a ticket, a waybill, a label, a package container (such as a box or envelope), a portion thereof or the like. As will also be appreciated, antenna 10 may also form a basis for a radio frequency identification tag circuit chip assembly (i.e., substrate and conductive pattern) as described in the aforementioned United States Patent Application entitled "Radio Frequency Identification Tag Having an Article Integrated Antenna" without departing from the fair scope of the present invention. As seen, antenna 10 includes a conductive pattern 22 disposed upon a substrate 16.

With continued reference to FIG. 1, substrate 16 may be paper, plastic (including polyester and metalized polyester material), synthetic paper, reinforced paper, cardboard, synthetic paper coated cardboard and the like chosen for the particular application. Substrate 16 includes a first surface 18 and a second surface 20. Formed on first surface 18 is a conductive pattern 22 including a first antenna element 24 and a second antenna element 26. Each of first antenna element 24 and second antenna element 26 are formed from a conductive material that is bonded or otherwise formed on substrate 16. Most preferably, each of first antenna element 24 and second antenna element 26 are formed by printing, using a suitable printable conductive medium. For example, a carbon/graphite based conductive ink forms an effective conductive pattern 22 when printed onto paper and/or cardboard. Synthetic and coated papers may alternatively be used, but at added cost. Silver and other precious metal inks may be used particularly for printing on plastic materials, but are less preferred due to higher material costs. Conductive pattern 22 is shown to have an "H" shape as would be suitable for use in an electrostatic application. It will be appreciated that other patterns more suitable to, for example, inductive coupling may be printed without departing from the fair scope of the present invention. First antenna element 24 is formed with a first coupling region 28 and second antenna element 26 is formed with a second coupling region 30. First coupling region 28 and second coupling region 30 extend toward and are separated by an aperture 31 formed in substrate 16 at generally the center of the H shape.

Figure 2:
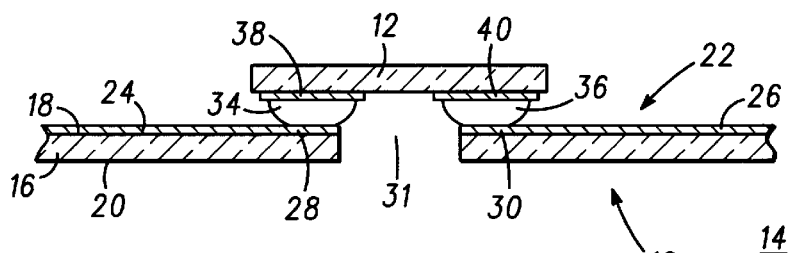
FIG. 2 is a cross-section view taken along line 2—2 of FIG. 1.

With reference to FIG. 1 and FIG. 2, circuit chip 12 is formed with a conductive pad 38 and a conductive pad 40 arranged for coupling to conductive pattern 22. As shown, conductive pad 38 and conductive pad 40 are "bumped" pads. That is, they project outwardly from a lower surface 32 of circuit chip 12. This is in contrast to "surface" pads, which are formed substantially coplanar with lower surface 32 of a circuit chip. When secured to antenna 10, conductive pad 38 electrically couples to first coupling region 28 and conductive pad 40 electrically couples to second coupling region 30. As shown in FIG. 2, a layer of conductive adhesive 34 and a layer of conductive adhesive 36 are respectively disposed between conductive pad 38 and first coupling region 28 and between conductive pad 40 and second coupling region 30 providing the electrical coupling and bonding circuit chip 12 to antenna 10. In a preferred embodiment of the present invention an isotropic adhesive is used and accurately applied to either or both of circuit chip 12 and antenna 10. Alternatively, an anisotropic adhesive may be used but at a cost penalty. It should also be noted that no particular preference exists for the use of bumped pads, and either bumped pads, surface pads or recessed pads (i.e., conductive pads formed recessed into an outer surface of circuit chip 12) may be used, selected based upon cost and the particular application. In the past, circuit chip 12 has been available from Temic North America, Inc., Basking Ridge, N.J. as well as Motorola's Indala Corporation, San Jose, Calif.

A preferred anisotropic adhesive is 3M 9703 adhesive available from 3M Corporation. The preferred adhesive is anisotropic in that it conducts in the "z" or vertical direction only (FIG. 2). The adhesive is manufactured to include metallic coated micro-sized pellets in an adhesive substrate that make electrical contact from a top surface to a lower surface of an adhesive layer. Electrical contact is not made in either of the "x" or "y" directions, i.e., the plane of the adhesive layer. Thus, adhesive may be applied in a complete layer without shorting across adjacent conductors. A preferred isotropic adhesive is #8103 available from Adhesives Research, Inc.

Figure 3:
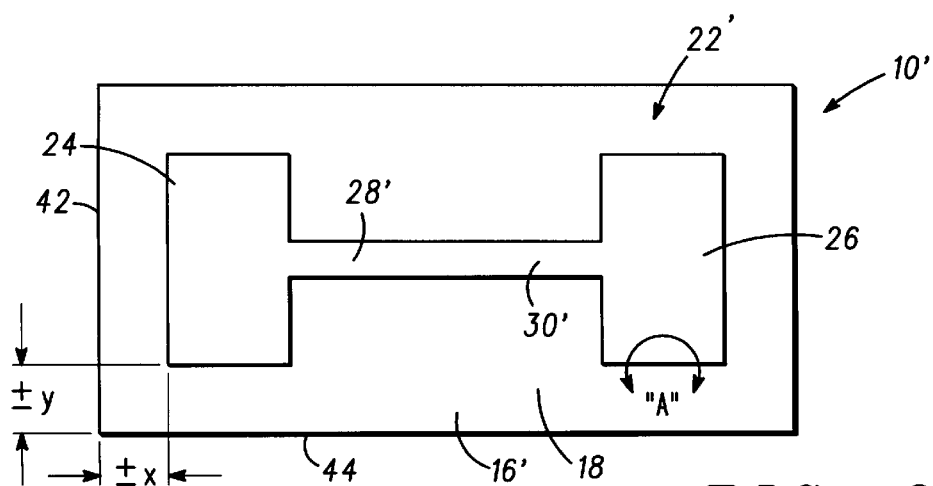
FIG. 3 is a plan view of an antenna and/or conductive pattern as printed onto a substrate.

To assist in the understanding of the present invention, and referring to FIG. 3, antenna 10' is shown in an intermediate processing stage. Antenna 10' represents an intermediate manufacturing stage of antenna 10. For clarity, primed reference numerals are used to identify elements that are not completely formed at this intermediate stage. Referring then to FIG. 3, antenna 10' is formed by first forming, preferably by printing, conductive pattern 22' on substrate 16'. As can be seen, aperture 31 has not yet been formed, and first coupling region 28' joins second coupling region 30' at the center of conductive pattern 22'.

Figure 4:
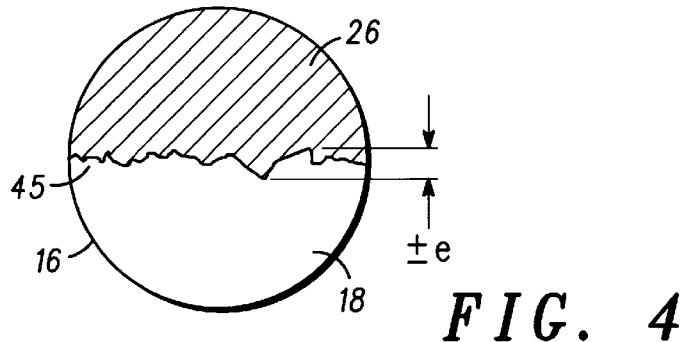
FIG. 4 is a plan view of an enlarged portion of the antenna illustrated in FIG. 3 in the area of circle "A".

FIG. 3 also illustrates the manufacturing tolerances associated with forming conductive pattern 22' on substrate 16'. A discussion of these tolerances and the effect they have on a completed antenna 10 will provide additional insight as to the advantages of the present invention. With reference to FIG. 3, even with very accurate printing processes, conductive pattern 22' will vary in both the "x" and "y" directions with respect to an edge 42 and an edge 44, respectively, of substrate 16'. Typically, the variation, respectively indicated as +/−x and +/−y, is on the order of about +/−0.5 mm in each direction. In addition, and with reference to FIG. 4, periphery 45 of conductive pattern 22' is not a sharp line, but instead, "bleeding" of the conductive ink as a result of non-uniform drying causes periphery 45 to have a rough profile. The variation of periphery 45, indicated as +/−e in FIG. 4, can be as much as +/−0.125 mm. Total variation resulting from both pattern position variation and bleeding can range as high as +/−1.5 mm. Significant in this number is the fact that circuit chip 12 is 1 mm square. Thus, the variation of the conductive pattern may be larger than circuit chip 12. As a result, positioning circuit chip 12 to conductive pattern 22 referencing only edge 42 and edge 44 is impossible. Automated attachment of circuit chip 12 therefore requires sophisticated, expensive vision technology to accurately locate the position of conductive pattern 22 on substrate 16. The alternative to expensive vision automation is manual attachment. Manual attachment is time consuming and does not offer the process repeatability of automation. In either case, cost, quality and process efficiency suffers tremendously.

Figure 5:
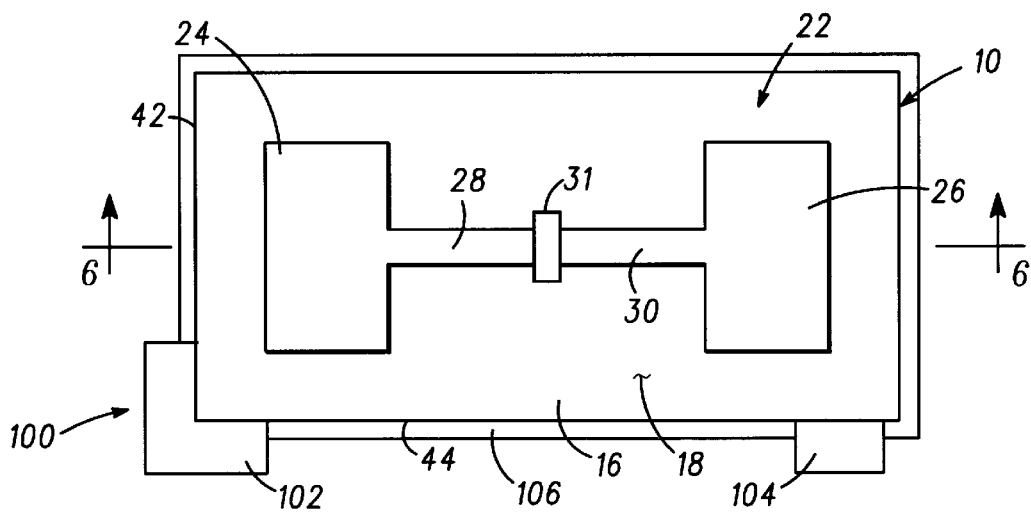
FIG. 5 is a plan view of the antenna and/or conductive pattern illustrated in FIG. 4 and further formed in accordance with a preferred embodiment of the present invention.

With reference then to FIG. 5, antenna 10 in a completed stage includes aperture 31 formed in substrate 16 separating first coupling region 28 and second coupling region 30. In accordance with a preferred embodiment of the present invention, aperture 31 is formed by punching out a portion of substrate 16 at a center of conductive pattern 22 relative to a substrate reference.

Figure 6:
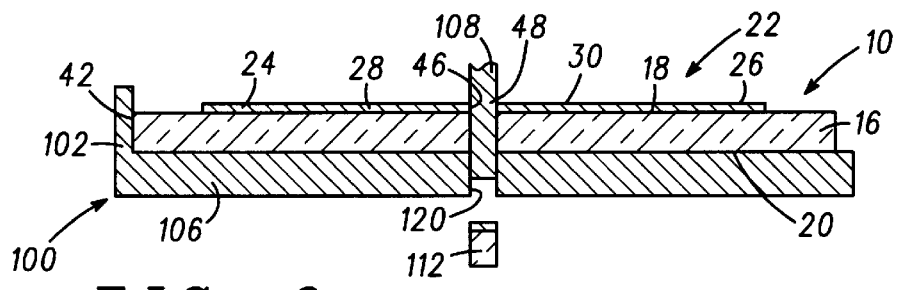
FIG. 6 is a cross-section view taken along line 6—6 of FIG. 5 and further illustrating an apparatus for making an antenna in accordance with a preferred embodiment of the present invention.

With continued reference to FIG. 5 and reference to FIG. 6, antenna 10' is positioned to a fixture 100. Fixture 100 includes corner locator block 102 and edge locator block 104 extending above a base 106. An alternate positioning arrangement may use pins engaging locator holes/slots formed in substrate 16'. Corner locator block 102 is arranged to engage both edge 42 and edge 44, with edge 42 and edge 44 providing the substrate reference. Edge locator block 104 is arranged to engage edge 44. In this manner, a consistent, repeatable reference for forming an aperture 31 is established with respect to edge 42 and edge 44. Also secured relative to fixture 100, and shown in FIG. 6, is a punch 108. In operation, antenna 10' is positioned with respect to corner locator block 102 and edge locator block 104 on base 106. Punch 108 engages conductive pattern 22' and substrate 16' shearing a plug 112 therefrom as punch 108 passes through conductive pattern 22' and substrate 16' and into button aperture 120. Aperture 31 thus precisely separates first coupling region 28' and second coupling region 30'. Moreover, first coupling region 28' and second coupling region 30' are precisely located with respect to edge 42 and edge 44 making simplified automated attachment of circuit chip 12 possible. It is anticipated that an edge 46 of first coupling region 28' and an edge 48 of second coupling region 30' may be formed to within +/−0.025 mm, respectively, from edge 42 and edge 44.

In completing a radio frequency identification tag 14 in accordance with preferred embodiments of the present invention, circuit chip pick-and-place automation (not shown) may be arranged to reference edge 42 and edge 44. From this reference, a circuit chip 12 may be accurately positioned with respect to first coupling region 28' and second coupling region 30'. It should be further appreciated that a single manufacturing/assembly cell may be constructed. Such an assembly cell would provide for automated placement of substrate 16', printing using a suitable print head conductive pattern 22', forming an aperture 31, and positioning the circuit chip 12. However, in accordance with preferred embodiments of the present invention, each of these operations may be completed in separate manufacturing/assembly cells arranged, for example, in production line fashion. Accurate formation of first coupling region 28' and second coupling region 30' with respect to substrate 16', and accurate placement of a circuit chip 12 with respect to these regions is maintained throughout the process. Thus, the present invention advantageously provides substantial manufacturing flexibility.

Figure 7:
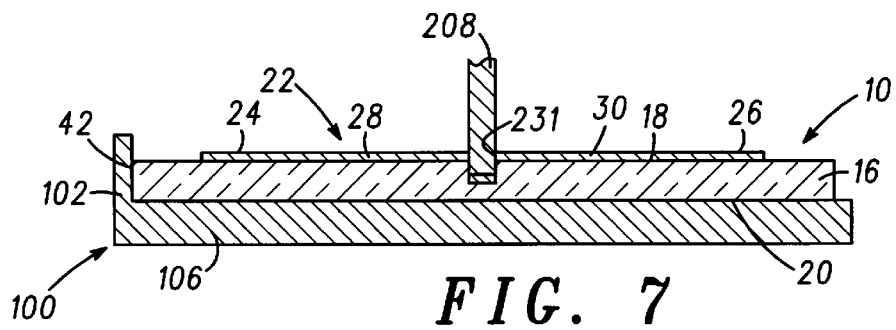
FIG. 7 is a cross-section view similar to FIG. 6 and illustrating an alternate preferred embodiment of the present invention.
Figure 8:
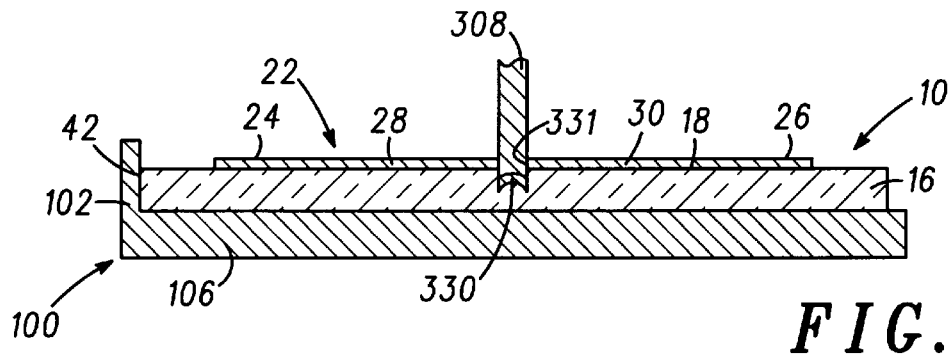
FIG. 8 is a cross-section view similar to FIG. 6 and illustrating an alternate preferred embodiment of the present invention.

Referring to FIG. 7, an alternate preferred embodiment of the present invention is shown. Again, antenna 10' represents an intermediate manufacturing stage of antenna 10. For clarity, primed reference numerals are used to refer to elements that are not completely formed at this intermediate stage (as shown in FIG. 3). As seen in FIG. 7, punch 208 is arranged to sever conductive pattern 22' and surface 18' and compress a portion of substrate 16' without forming a through aperture in substrate 16'. Fixture 100 is constructed as before and includes corner locator block 102 and edge locator block 104. Button aperture 120 is omitted. Punch 208 engages conductive pattern 22' and surface 18' at the interface of first coupling region 28' and second coupling region 30' severing conductive pattern 22' and surface 18' at the point of engagement. Punch 208 further compresses a portion of substrate 16' such that an indentation 231 is created separating first coupling region 28' from second coupling region 30'. Again, very precise location of first coupling region 28' and second coupling region 30' is obtained with respect to edge 42 and edge 44 thereby permitting automated placement of a circuit chip 12. In FIG. 8, punch 308 is arranged with a bladed edge 330 to better pierce conductive pattern 22' and surface 18' for forming an indentation 331 in substrate 16'.

Figure 9:
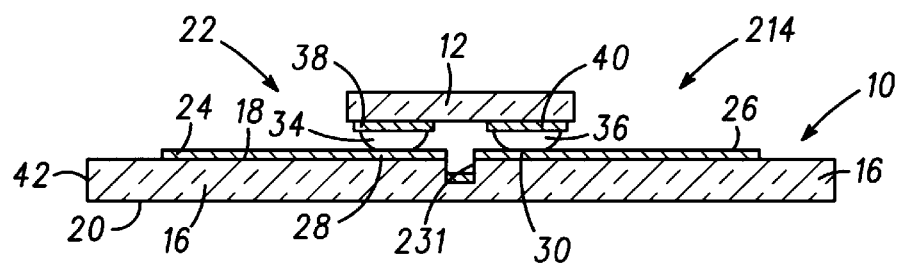
FIG. 9 is a cross-section view similar to FIG. 2 and illustrating an alternate preferred embodiment of the present invention.

With reference then to FIG. 9, in completing a radio frequency identification tag 214 in accordance with preferred embodiments of the present invention, circuit chip pick-and-place automation (not shown) may be arranged to reference edge 42 and edge 44 of substrate 16 (edge 42 shown in FIG. 9). From this reference, circuit chip 12 may be accurately positioned with conductive pad 38 electrically coupled via adhesive 34 to first coupling region 28 and conductive pad 40 electrically coupled via adhesive 36 to second coupling region 30. First coupling region 28 and second coupling region 30 are precisely located and electrically isolated via indentation 231 extending through conductive pattern 22 and surface 18 and into substrate 16.

Figure 10:
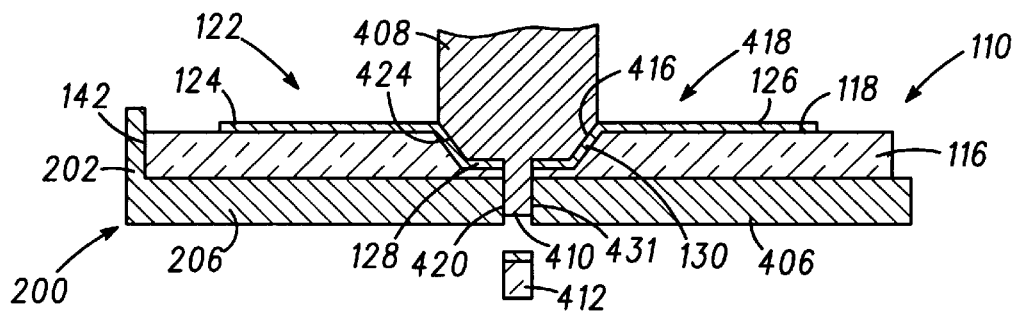
FIG. 10 is a cross-section view similar to FIG. 6 and illustrating an alternate preferred embodiment of the present invention.

FIG. 10 illustrates still another alternate preferred embodiment of the present invention for forming an antenna 110. Fixture 200 includes corner locator block 202 and an edge locator block (not shown) extending above a base 406. An alternate locating arrangement may use locator pins engaging holes/slots formed in substrate 16'. Corner locator block 202 is arranged to engage two edges of substrate 116 (edge 142 shown in FIG. 10) and the edge locator block is arranged to engage one edge of substrate 116 as described. Also secured relative to fixture 200 is a forming/punch 408. Punch 408 includes a punch portion 410 arranged to engage conductive pattern 122 and substrate 116 shearing a plug 412 therefrom as it passes through conductive pattern 22' and substrate 16' and into button aperture 420. In this manner, an aperture 431 is formed in substrate 116 separating coupling region 128 and coupling region 130. Moreover, first coupling region 128 and second coupling region 130 are precisely located with respect to the edges of substrate 116 making simplified automated attachment of circuit chip 112 possible.

Punch 408 is further arranged with a shoulder or forming portion 424. As punch 408 engages substrate 116, a localized region 418 of substrate 116 is compressed and formed to substantially correspond to the shape of shoulder 424. In this manner, a recess 416 is formed in substrate 116 adjacent aperture 431 and into which first coupling region 128 and second coupling region 130 extend.

Figure 11:
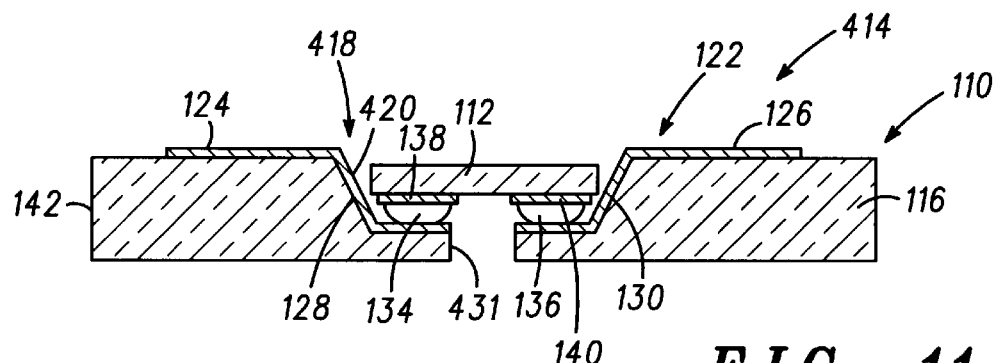
FIG. 11 is a cross-section view similar to FIG. 2 and illustrating an alternate preferred embodiment of the present invention.

With reference then to FIG. 11, a radio frequency identification tag 414 is assembled using antenna 110. In accordance with preferred embodiments of the present invention, circuit chip pick-and-place automation (not shown) may be arranged to reference the edges of substrate 116 (edge 142 shown in FIG. 11). From this reference, circuit chip 112 may be accurately positioned with conductive pad 138 electrically coupled via adhesive 134 to first coupling region 128 and conductive pad 140 electrically coupled via adhesive 136 to second coupling region 130. First coupling region 128 and second coupling region 130 are precisely located and isolated from each other via aperture 431 extending through conductive pattern 122 and substrate 116. In this manner, circuit chip 112 is coupled to each of first antenna element 124 and second antenna element 126 disposed on surface 118 of substrate 116. In addition, circuit chip 112 is maintained below surface 118 thereby reducing the potential for it becoming dislodged from substrate 116 during use of radio frequency identification tag 414. It should also be appreciated that a potting material and/or a cover may be disposed over circuit chip 112 thereby offering further protection.

In summary, and referring again to FIG. 1, a radio frequency identification tag 14 includes a radio frequency identification tag circuit chip 12 secured to an antenna 10. The antenna includes a first antenna element 24 and a second antenna element 26 formed on a surface 18 of a substrate 16. The first antenna element and the second antenna element are separated and precisely located by an aperture 31 formed in the substrate.

Referring to FIG. 7 and FIG. 8, alternative preferred embodiments of antenna 10 include a first antenna element 24 and a second antenna element 26 formed on a surface 18 of a substrate 16. The first antenna element and the second antenna element are separated and precisely located by an indentation 231 and 331, respectively shown in FIG. 7 and FIG. 8, formed through the surface and extending partially into the substrate.

With reference to FIG. 9, a radio frequency identification tag 214 includes a radio frequency identification tag circuit chip 12 secured to an antenna 10. The antenna includes a first antenna element 24 and a second antenna element 26 formed on a surface 18 of a substrate 16 with the first antenna element and the second antenna element being separated and precisely located by an indentation 31 formed in the substrate.

In yet another preferred embodiment of the present invention, and with reference to FIG. 10, an antenna 110 includes a first antenna element 124 and a second antenna element 126 formed on a surface 118 of a substrate 116. The substrate is formed to include a recess 416 formed in the substrate. The first antenna element includes a first coupling region 128 and the second antenna element includes a second coupling region 130. The first coupling region and the second coupling region extend into the recess and are separated and precisely located by an aperture 431 formed in the recess.

With reference to FIG. 11, a radio frequency identification tag 414 includes a radio frequency identification tag circuit chip 112 secured to an antenna 110. The antenna includes a first antenna element 124 and a second antenna element 126 formed on a surface 118 of a substrate 116. Antenna 110 also includes a recess 416 formed in substrate 116 and a first coupling region 128 and a second coupling region 130 extending into the recess and separately and precisely located by an aperture 431 formed in the recess. A radio frequency identification tag circuit chip is secured in the recess and is coupled to the first coupling region and the second coupling region. The first coupling region and the second coupling region thereby couple the radio frequency identification tag circuit chip to the first antenna element and the second antenna element.

In accordance with a preferred method of making a radio frequency identification tag, a substrate having a surface is provided. A conductive pattern is printed on the surface, and an aperture is formed in the substrate relative to a substrate reference, the aperture separating the conductive pattern into a first antenna element and a second antenna element. A radio frequency identification tag circuit chip is then secured to the substrate and electrically coupled to the first antenna element and the second antenna element. The method may alternatively provide for forming an indentation and/or a recess in the substrate.

Some advantages of the present invention are now discussed.

Limitations in the ability to control dimension and position tolerances of printed antennas have limited this cost effective and performance enhancing technology in radio frequency identification tags. The present invention facilitates the use of printed antenna technology by overcoming these tolerance limitations.

Radio frequency identification tag cost is reduced while performance is increased through the use of printed antennas that may be easily mated to radio frequency identification tag circuit chips.

Manufacturing efficiency is improved by the present invention in that radio frequency identification tag circuit chips are quickly and accurately secured and coupled to a radio frequency identification tag antenna.

The present invention also allows for the economical manufacture of radio frequency identification tags in single cell or multiple cell manufacturing arrangements using commonly available pick-and-place automation.

Many additional changes and modifications could be made to the invention without departing from the fair scope and spirit thereof. The scope of some changes is discussed above. The scope of others will become apparent from the appended claims.

I claim:

1. A radio frequency identification tag comprising:
 a radio frequency identification tag circuit chip secured to an antenna, the antenna including a first antenna element and a second antenna element formed on a surface of a substrate, the first antenna element isolated from the second antenna element by an aperture formed in the substrate.

2. The radio frequency identification tag of claim 1, the first antenna element including a first coupling region and the second antenna element including a second coupling region, and the aperture isolating the first coupling region and the second coupling region.

3. The radio frequency identification tag of claim 2, the first coupling region and the second coupling region arranged for coupling to the radio frequency identification tag circuit chip.

4. The radio frequency identification tag of claim 1, the aperture formed relative to a substrate reference.

5. The radio frequency identification tag of claim 4, the substrate reference comprising an edge of the substrate.

6. The radio frequency identification tag of claim 1, the antenna being a conductive pattern printed on the surface of the substrate.

7. The radio frequency identification tag of claim 1, a conductive adhesive coupling the radio frequency identification tag circuit chip to the antenna.

8. A radio frequency identification tag comprising:
 a radio frequency identification tag circuit chip secured to an antenna, the antenna including a first antenna element and a second antenna element formed on a surface of a substrate, the first antenna element isolated from the second antenna element by an indentation extending through the surface and the substrate, the antenna extending into the indentation and contacting side walls thereof.

9. The radio frequency identification tag of claim 8, wherein the first antenna element has a first coupling region and the second antenna element has a second coupling region, the first coupling region and the second coupling region disposed on at least a portion of the indentation.

10. The radio frequency identification tag of claim 9, the first coupling region and the second coupling region arranged for coupling to the radio frequency identification tag circuit chip.

11. The radio frequency identification tag of claim 8, the indentation formed relative to a substrate reference.

12. The radio frequency identification tag of claim 11, the substrate reference comprising at least an edge of the substrate.

13. The radio frequency identification tag of claim 8, the antenna being a conductive pattern printed on the surface.

14. The radio frequency identification tag of claim 8, a conductive adhesive coupling the radio frequency identification tag circuit chip to the antenna.

15. A radio frequency identification tag comprising:
 a radio frequency identification tag circuit chip secured to an antenna, the antenna including a first antenna element and a second antenna element formed on a surface of a substrate, the first antenna element isolated from the second antenna element by an aperture formed in the substrate, and a recess formed in the substrate adjacent the aperture.

16. The radio frequency identification tag of claim 15, the first antenna element including a first coupling region and the second antenna element including a second coupling region, and the aperture isolating the first coupling region and the second coupling region.

17. The radio frequency identification tag of claim 16, the first coupling region and the second coupling region extending into the recess.

18. The radio frequency identification tag of claim 17, the first coupling region and the second coupling region arranged for coupling to the radio frequency identification tag circuit chip.

19. The radio frequency identification tag of claim 15, the aperture formed relative to a substrate reference.

20. The radio frequency identification tag of claim 19, the substrate reference comprising at least one edge of the substrate.

21. The radio frequency identification tag of claim 15, the antenna being a conductive pattern printed on a surface of the substrate.

22. The radio frequency identification tag of claim 15, a conductive adhesive coupling the radio frequency identification tag circuit chip to the antenna.

23. The radio frequency identification tag of claim 15, the radio frequency identification tag circuit chip being disposed in the recess and below the surface.

24. An antenna for a radio frequency identification tag comprising:
 a conductive pattern printed on a surface of a substrate and an aperture formed in the substrate separating the conductive pattern into a first antenna element and a second antenna element.

25. The antenna of claim 24, the first antenna element including a first coupling region and the second antenna element including a second coupling region, the first coupling region and the second coupling region defined by the aperture.

26. The antenna of claim 24, wherein the substrate forms a portion of an article of manufacture selected from the group consisting of: a package, a package container, an envelope, a ticket, a waybill, a label, and an identification badge.

27. The antenna of claim 24, the aperture formed relative to a substrate reference.

28. The antenna of claim 27, the substrate reference comprising an edge of the substrate.

29. An antenna for a radio frequency identification tag comprising:
 a conductive pattern disposed on a surface of a substrate and on a portion of an indentation in the substrate, said indentation extending through the surface and partially into the substrate and separating the conductive pattern into a first antenna element and a second antenna element.

30. The antenna of claim 29, the first antenna element including a first coupling region and the second antenna element including a second coupling region, the first coupling region and the second coupling region defined by the indentation.

31. The antenna of claim 29, the antenna forming a portion of one of an article, a package, a package container, an envelope, a ticket, a waybill, a label, and an identification badge.

32. The antenna of claim 29, the indentation formed relative to a substrate reference.

33. The antenna of claim 32, the substrate reference comprising an edge of the substrate.

34. An antenna for a radio frequency identification tag comprising:

a conductive pattern printed on a surface of a substrate, an aperture formed in the substrate separating the conductive pattern into a first antenna element and a second antenna element and a recess formed in the substrate and adjacent the aperture.

35. The antenna of claim 34, the first antenna element including a first coupling region and the second antenna element including a second coupling region, the first coupling region and the second coupling region defined by the aperture.

36. The antenna of claim 34, the antenna forming a portion of one of an article, a package, a package container, an envelope, a ticket, a waybill, a label, and an identification badge.

37. The antenna of claim 34, the aperture formed relative to a substrate reference.

38. The antenna of claim 37, the substrate reference comprising an edge of the substrate.

39. A method for making a radio frequency identification tag, the method comprising the steps of:

providing a substrate having a surface;

printing a conductive pattern on the surface;

forming an aperture in the substrate relative to a substrate reference, the aperture separating the conductive pattern into a first antenna element and a second antenna element; and electrically coupling a radio frequency identification tag circuit chip to the first antenna element and the second antenna element.

40. The method of claim 39, wherein the step of printing a conductive pattern comprises, printing a first antenna element and a second antenna element joined by a first coupling region and a second coupling region, and the step of forming an aperture comprises forming an aperture separating the first coupling region and the second coupling region.

41. The method of claim 40, the radio frequency identification tag circuit chip being coupled to the first coupling region and the second coupling region.

42. The method of claim 39, the step of forming an aperture comprising:

locating the substrate within a fixture, and punching the aperture in the substrate.

43. A method for making a radio frequency identification tag, the method comprising the steps of:

providing a substrate having a surface;

printing a conductive pattern on the surface;

forming an indentation in the substrate relative to a substrate reference, the indentation separating the conductive pattern into a first antenna element and a second antenna element; and electrically coupling a radio frequency identification tag circuit chip to the first antenna element and the second antenna element.

44. The method of claim 43, wherein the step of printing a conductive pattern comprises, printing a first antenna element and a second antenna element joined by a first coupling region and a second coupling region, and the step of forming an indentation comprises forming an indentation separating the first coupling region and the second coupling region.

45. The method of claim 44, the radio frequency identification tag circuit chip being coupled to the first coupling region and the second coupling region.

46. The method of claim 43, the step of forming an indentation comprising severing the surface and partially compressing the substrate.

47. The method of claim 46, the step of forming an indentation comprising locating the substrate within a fixture.

48. A method for making a radio frequency identification tag, the method comprising the steps of:

providing a substrate having a surface;

printing a conductive pattern on the surface;

forming an aperture in the substrate relative to a substrate reference, the aperture separating the conductive pattern into a first antenna element and a second antenna element;

forming a recess in the substrate adjacent the aperture; and disposing a radio frequency identification tag circuit chip in the recess and electrically coupling the radio frequency identification tag circuit chip to the first antenna element and the second antenna element.

49. The method of claim 48, wherein the step of printing a conductive pattern comprises, printing a first antenna element and a second antenna element joined by a first coupling region and a second coupling region, and the step of forming an aperture comprises forming an aperture separating the first coupling region and the second coupling region.

50. The method of claim 49, the radio frequency identification tag circuit chip being coupled to the first coupling region and the second coupling region.

51. The method of claim 48, the step of forming an aperture comprising:

locating the substrate within a fixture, and punching the aperture in the substrate.

* * * * *